(12) United States Patent
Tillich et al.

(10) Patent No.: US 7,836,384 B2
(45) Date of Patent: Nov. 16, 2010

(54) ERROR-CORRECTION CODING METHOD COMPRISING LOCAL ERROR DETECTION CODES INTERCONNECTED BY STATE WORDS, CORRESPONDING DECODING METHOD, TRANSMITTING, RECEIVING AND STORAGE DEVICES AND PROGRAM

(75) Inventors: Jean-Pierre Tillich, Antony (FR); Iryna Andriyanova, Rennes (FR); Jean-Claude Carlac'h, Rennes (FR); Emmanuel Cadic, Sartrouville (FR)

(73) Assignee: France Telecom, Paris (FR)

( * ) Notice: Subject to any disclaimer, the term of this patent is extended or adjusted under 35 U.S.C. 154(b) by 479 days.

(21) Appl. No.: 11/597,927

(22) PCT Filed: May 17, 2005

(86) PCT No.: PCT/FR2005/001238

§ 371 (c)(1),
(2), (4) Date: Apr. 15, 2008

(87) PCT Pub. No.: WO2006/000666

PCT Pub. Date: Jan. 5, 2006

(65) Prior Publication Data

US 2008/0201631 A1    Aug. 21, 2008

(30) Foreign Application Priority Data

May 28, 2004    (FR) .................................. 04 05847

(51) Int. Cl.
*H03M 13/03*    (2006.01)

(52) U.S. Cl. ...................................... 714/790; 714/792

(58) Field of Classification Search ................. 714/752, 714/786, 755, 790, 792
See application file for complete search history.

(56) References Cited

U.S. PATENT DOCUMENTS

| | | | |
|---|---|---|---|
| 5,706,312 A * | 1/1998 | Wei ............................. 375/298 |
| 6,105,159 A * | 8/2000 | Frederickson ............... 714/762 |
| 6,233,271 B1 * | 5/2001 | Jones et al. ................. 375/142 |
| 6,883,133 B1 * | 4/2005 | Gupta ......................... 714/786 |
| 6,961,889 B2 * | 11/2005 | Shin ........................... 714/755 |
| 6,976,203 B2 * | 12/2005 | Kurtas et al. ................ 714/755 |
| 7,000,167 B2 * | 2/2006 | Coker et al. ................. 714/752 |
| 7,234,100 B1 * | 6/2007 | Sadowsky .................... 714/792 |
| 7,243,294 B1 * | 7/2007 | Divsalar et al. ............. 714/792 |
| 7,284,186 B2 * | 10/2007 | Siegel et al. ................ 714/802 |

(Continued)

OTHER PUBLICATIONS

European Search Report from counterpart foreign application No. FR2005/001238 filed May 17, 2005.

(Continued)

*Primary Examiner*—Esaw T Abraham
(74) *Attorney, Agent, or Firm*—David D. Brush; Westman, Champlin & Kelly, P.A.

(57) ABSTRACT

A coding method is provided for associating redundant and source data and for carrying out a plurality of local codes associating at least one input status word and at least one output status word according to at least one label word and permutations applicable on at least certain of said words. The local codes are embodied in the form of detection codes and not error correction codes on a predetermined coding alphabet. The local codes are interconnected by the status words in such a way that at least one coding matrix is formed, each of which defining a base code.

22 Claims, 9 Drawing Sheets

U.S. PATENT DOCUMENTS 7,289,569 B2 * 10/2007 Markman .................. 375/265
7,484,168 B2 * 1/2009 Siegel et al. ................ 714/801

OTHER PUBLICATIONS

Forney, G.D., *Codes on Graphs: Normal Realizations*, IEEE Transactions of Information Theory, vol. 47, No. 2, Feb. 2001.

Berrou C. et al., *Near Shannon Limit Error—Correcting Coding and Decoding: Turbo-Codes (1)*, Proceedings of the international conference in communications (ICC), Geneva, May 23-26, 1993, New York, IEEE, US, vol. 3, May 23, 1993.

Richardson, Thomas J. et al., *The Capacity of Low-Density Parity-Check Codes Under Message-Passing Decoding*, IEEE Transactions of Information Theory, vol. 47, No. 2, Feb. 2001.

Robert G. Gallager, *Low-Density Parity-Check Codes*, MIT, USA, 1963.

Thomas J. Richardson et al., *Design of Capacity-Approaching Irregular Low-Density Parity-Check Codes*, IEEE Transactions on Information Theory, vol. 47, No. 2, Feb. 2001.

R. Michael Tanner, *A Recursive Approach to Low Complexity Codes*, IEEE Transaction on Information Theory, vol. IT-27, No. 5, pp. 533-547, Sep. 1981.

Dariush Divsalar et al., *Coding Theorems for "Turbo-Like" Codes*, Proceedings of the annual Allerton conference on communication, control and computing, pp. 201-210, 1998.

Written Opinion from counterpart foreign application No. FR2006/010238 filed May 17, 2005.

\* cited by examiner

——— (6,4,2) curve on 2 states
+—+—+ y=x/0.610

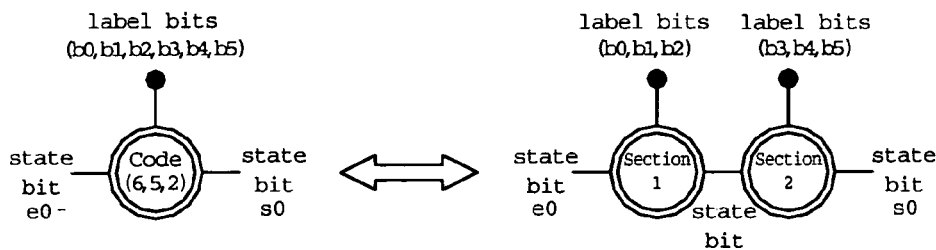
Fig. 13
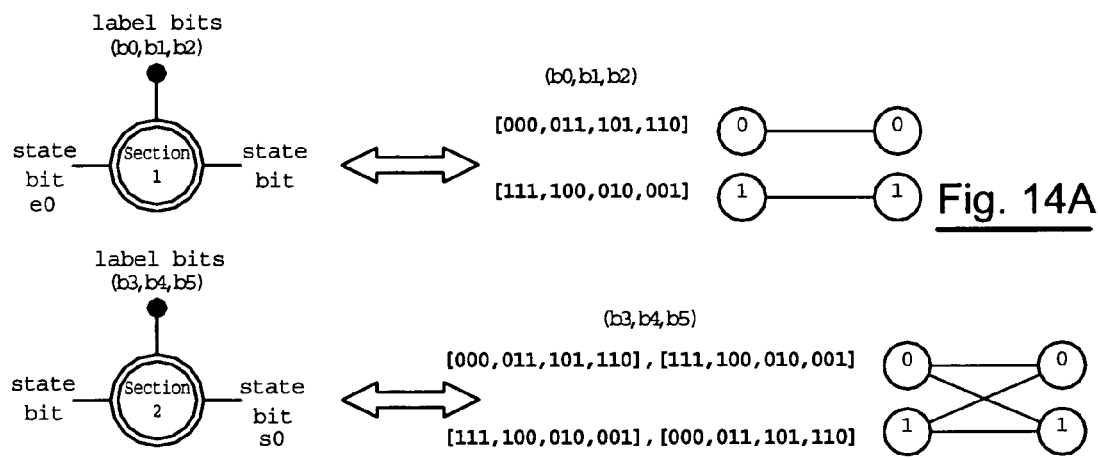
Fig. 14A
Fig. 14B
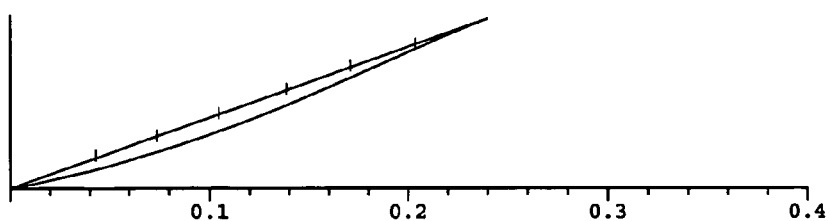
Fig. 15

ERROR-CORRECTION CODING METHOD COMPRISING LOCAL ERROR DETECTION CODES INTERCONNECTED BY STATE WORDS, CORRESPONDING DECODING METHOD, TRANSMITTING, RECEIVING AND STORAGE DEVICES AND PROGRAM

CROSS-REFERENCE TO RELATED APPLICATION

This Application is a Section 371 National Stage Application of International Application No. PCT/FR2005/001238, filed May 17, 2005, and published as WO 2006/000666A1 on Jan. 5, 2006, not in English.

FIELD OF THE DISCLOSURE

The field of the disclosure is that of the encoding of digital data, with a view especially to its transmission or storage. More specifically, the disclosure relates to error correction codes.

The disclosure can be applied in all fields where it is necessary or at least desirable to have an error correction code. Thus, the disclosure can be applied for example to:
- protection against errors due to the noise and interference inherent in physical transmission channels (classic error correction encoding and space-time codes for multiple-antenna systems), for example for applications in wireless telecommunications systems such as the DECT, GSM, UMTS systems, local and home automation networks, satellite telecommunications etc.
- CDMA encoding;
- the compression of signals coming from information sources: images, sounds, signals, data etc.
- protection against errors in the storage of data in mass memories such as computer disks or microprocessors.

BACKGROUND

Numerous encoding techniques for error correction are already known. The first studies on the subject go back to the 1940s. For it was then that Shannon laid the basis of information theory which is still in use today.

Numerous encoding families were then proposed. The current state-of-the-art error correction codes are well represented by the most recent turbo codes and the LDPC codes.

Turbo-codes were invented in 1991 by Berrou and Glavieux [3] (the references cited are grouped together at the end of the description, in paragraph 9).

As illustrated in FIG. 1, the turbo-codes encode (i.e. compute a block of redundancy bits Y1) an information block (X-bit block) for a first time by means of a convolutive encoding 11 described by a trellis having a small number of states (generally 8 to 16), then permutate or interlace the information block in another order (12) to encode them once again (13) to give the block of redundancy bits Y2.

The transmitted encoded block is therefore formed by X, Y1 and Y2, or even other permutated blocks 14 or encoded blocks 15 of additional redundancies Yi.

The publication of turbo-codes and the discovery of their performance characteristics for low decoding complexity compatible with the technology of electronic chips for large-scale consumer applications in the 1990s has given rise to numerous articles on error correction codes and their soft-decision iterative decoding. It became finally possible to approach Shannon's limit published in 1948 to transmit information at a bit rate approaching the maximum borderline capacity of the channel used, whether on an electric wire link, an optical wire link or a radio link.

This renewal of the field of information theory led to the rediscovery, in 1995, of the LDPC ("Low-Density Parity Check") invented by Gallager [1] in 1960, and work by Tanner [2] generalizing these codes in 1981, and then by the publication of a variant of the LDPC codes: the RA ("Repeat-Accumulate") codes [4] by Divsalar and McEliece in 1998.

LDPC codes are defined by a parity check matrix H that is sparse, i.e. comprises very few 1s and many 0s (for binary codes). For non-binary LDPC codes such as, for example, those using the quaternary alphabet such as the ring Z4 of integers modulo 4: $\{0, 1, 2, 3\}$, the control matrix will have many 0s and very few non-zero symbols $\{1,2,3\}$.

For reasons of simplicity of definition of the matrix, the initial binary LDPC or "regular LDPCs" have been defined by a sparse parity check matrix having numbers of «1» $d_c$ per row and $d_v$ per column as in the example of an LDPC code (4,2) here below, with parameters $[n=12, k=8, d_{min}=2]$ (i.e. a code of length 12 with a check matrix having 4 "1s" on each row and 2 "1s" on each column):

$$H = \begin{bmatrix} 1 & 1 & 1 & 1 & 0 & 0 & 0 & 0 & 0 & 0 & 0 & 0 \\ 0 & 0 & 1 & 1 & 1 & 1 & 0 & 0 & 0 & 0 & 0 & 0 \\ 0 & 0 & 0 & 0 & 1 & 1 & 1 & 1 & 0 & 0 & 0 & 0 \\ 0 & 0 & 0 & 0 & 0 & 0 & 1 & 1 & 1 & 1 & 0 & 0 \\ 0 & 0 & 0 & 0 & 0 & 0 & 0 & 0 & 1 & 1 & 1 & 1 \\ 1 & 1 & 0 & 0 & 0 & 0 & 0 & 0 & 0 & 0 & 1 & 1 \end{bmatrix}$$

Another representation of the LDPC codes is their bipartite Tanner graph which represents the variables by nodes (or vertices) placed to the left in a graph and the check equations (or constraints) by XOR values represented by nodes placed to the right in this graph and linked to the binary variables by arms (or ridges).

FIG. 2 presents the bipartite Tanner graph corresponding to the above matrix. The vertices of the 12 variables $x_i$ with i=0, 1, ..., 11 are represented by black dots 21. The 6 constraints 22 (modulo sum 2) are placed to the right and referenced $C_j$ for j=0, 1, ..., 5. The permutations 23 are illustrated by arms interconnecting the variables and the constraints.

It can be seen that the number of 1s equal to 4 on one row of the check matrix H of the code is also the number of inputs of each XOR constraint. This number is also called degree of the constraint or of the local code and is referenced $d_c$. Similarly, the number of 1s equal to 2 on a column of the check matrix H of the code is also the number of repetitions of each variable. This number is also called degree of the variable and is referenced $d_v$. The rate of the overall code r=k/n has a lower limit:

$$r = \frac{k}{n} \geq 1 - \frac{d_v}{d_c}.$$

In general, the degrees may vary from one variable to another and the codes may be different. Should the XOR constraints be replaced by small codes known as "local" codes, the overall code is called a Tanner code.

FIG. 3 shows the architecture of the Tanner codes which is more general than that of the LDPC codes. The codes Ci 31 may be codes that are far more complex than a simple parity code obtained by an XOR operation as in the LDPC codes.

The turbo-codes, the LDPC codes and their variants provide performance characteristics, in terms of error correction, that are noteworthy for large block sizes of at least some thousands or tens of thousands of information bits but for a high complexity of computation when decoding which, however, remains compatible with the constantly increasing computation capacities of present-day microprocessors.

However, a major reduction in decoding complexity is greatly desired by manufacturers of components implementing these error correction encoding-decoding functions, because it would reduce the silicon surface area of the electronic chips that implement these functions and therefore their production costs, ultimately providing for a lower final cost for the consumer.

This reduction of complexity is also desired by all consumers because it also results in lower consumption of electrical power given, for example, by mobile telephone batteries or laptops connected to mobile radio telecommunications networks and therefore results in a greater autonomy of the portable terminal or in a lighter terminal.

The usual turbo-codes have a minimum distance at best logarithmic in length and the LDPC which approach the capacity of the channel are also at best logarithmic in length of the code:

$$d_{min} \underset{n \to \infty}{\propto} \mathrm{Log}(n).$$

A family of the code is said to be asymptotically good (AG) if the minimal distance of the codes increases linearly as the length of the code:

$$\text{``}AG\text{''} \Leftrightarrow \lim_{n \to \infty} \frac{d_{min}}{n} = Ct > 0.$$

The performance of known, present-day codes is therefore not optimum and can still be improved, in terms of both error correction capacity and reducing complexity of decoding.

Furthermore, the known structures of present-day codes show excessively low performance in terms of error correction for small block sizes, of the order of about a hundred to a thousand bits. The very great prevailing demand for the small-packet digital communications transmissions is the cause of interest in these small-length codes.

An increase in performance in terms of binary error rate may result especially in increasing the quality of service provided to the user:

improved range of base stations;

less noisy data transmission;

higher maximum information throughput rate available;

greater number of simultaneous users in a same zone covered by a base station.

SUMMARY

An embodiment relates to an encoding method associating redundancy data with source data and implementing a plurality of local codes setting up an association, with at least an input state word, of at least an output state word according to at least one label word and permutations applied to at least certain of said words. According to an embodiment of the invention, the local codes are detection codes but not error correction codes in a predetermined encoding alphabet and said local codes are interconnected by their state words so as to form at least one encoding trellis, each trellis defining a base code.

This novel and inventive approach, relying on the use of very simple base codes, goes against the preconceptions of those skilled in the art. The use of simple codes, which are only error detector codes, for building a comprehensive error correction code (called "total code") is not obvious.

This counter-intuitive approach makes it possible however to unexpectedly obtain very good results, which are better than those of the prior art codes described here above while at the same time obtaining reduced complexity. As shall be seen here below, an embodiment of the invention makes it possible to approach Shannon's limit.

Furthermore, an embodiment of the invention is efficient for many types of codes and especially for short error corrector codes in sharply limiting the phenomenon known as the "error-floor" phenomenon.

Advantageously, said permutations are applied to said label words and not to said state words.

Thus, a simplified system reducing the number of processed variables is obtained.

According to a first mode of implementation, said local codes are binary codes represented by two-state or four-state trellises.

According to a second mode of implementation, said local codes are defined on an encoding alphabet with $2^n$ elements, and are represented by trellises with $2^n$, $2^{n+1}$ or $2^{n+2}$ states (with n as an integer greater than 2). For example, for a four-element encoding, it could be represented by four-state, 8-state or 16-state trellises.

In both cases, it has to be noted that these are local codes that are very simple, hence very easy to implement.

Preferably, each of said base codes delivers code words with a length of m symbols, each corresponding to at least one bit, of an encoding alphabet defined so that:

the number of code words with a significance of 2 is lower than or equal to m/2;

the number of code words with a significance of 3 is not 0, the significance of a code word being the number of symbols different from 0 that it contains.

This structure gives very good encoding results.

Advantageously, at least one of said base code words is formed by at least two code sections.

According to an embodiment of the invention, it is also possible to implement a puncture on at least one of said base codes.

This puncturing can be applied to the variables and/or to the branches of the code.

According to an advantageous aspect of an embodiment of the invention, at least one of the trellises is a cyclical trellis.

At least one of the trellises may also be a trellis whose input state and output state are set at predetermined values.

According to a first embodiment of the invention, at least one of said local codes is a two-state code (6, 4, 2) setting up an association, with an input state bit, of an output state bit, as a function of six label bits, where:

6 is the length of said local code, or the number of its label bits;

4 is the size of said local code;

2 is the minimum distance from said base code.

In this case, said base code is advantageously formed by three sections of said code (6, 4, 2).

According to a second embodiment of the invention, at least one of said local codes is a two-state code (4, 3; 2) setting up an association, with an input state bit, of an output state bit, as a function of four label bits, where:
- 4 is the length of said local code, or the number of its label bits;
- 3 is the size of said local code;
- 2 is the minimum distance from said base code.

In this case, said base code is advantageously formed by two sections of said code (4, 3, 2).

According to a third embodiment of the invention, at least one of said local codes is a two-state code (6, 5, 2) setting up an association, with an input state bit, of an output state bit, as a function of six label bits, where:
- 6 is the length of said local code, or the number of its label bits;
- 5 is the size of said local code;
- 2 is the minimum distance from said base code.

In this case, said base code is advantageously formed by three sections of said code (6, 5, 2).

According to a fourth embodiment of the invention, at least one of said local codes is a four-state code (8, 7, 2) setting up an association, with an input state bit, of an output state bit, as a function of eight label bits, where:
- 8 is the length of said local code, or the number of its label bits;
- 7 is the size of said local code;
- 2 is the minimum distance from said base code.

According to a fifth embodiment of the invention, at least one of said local codes is a two-state code (8, 7, 2) setting up an association, with an input state bit, of an output state bit, as a function of eight label bits, where:
- 8 is the length of said local code, or the number of its label bits;
- 7 is the size of said local code;
- 2 is the minimum distance from said base code.

In the latter two cases, said base code is advantageously formed by eight sections of said code (8, 7, 2).

An embodiment of the invention also relates to a method for the decoding of data by means of the above-described encoding method.

A decoding method of this kind implements, symmetrically with the encoding, a plurality of local codes, setting up an association with at least one input state word, of at least one output state word as a function of at least one label word, and of the permutations applied to at least certain of said words, said local codes being detection codes but not error corrector codes on a predetermined encoding alphabet, and said local codes being interconnected by their state words, so as to form at least one encoding trellis, each trellis defining a base code.

An embodiment of the invention also relates to devices for the transmission of encoded data implementing the above-described encoding method, the devices for the reception of data, encoded by means of this encoding method, implementing the decoding means that act symmetrically with respect to the encoding, and the encoded data storage devices include encoding and/or decoding means according to the above-mentioned methods.

An embodiment of the invention also relates to computer programs implementing the encoding and/or decoding method described here above.

BRIEF DESCRIPTION OF THE DRAWINGS

Other features and advantages shall appear more clearly from the following description of an embodiment of the invention, given by way of a simple illustrative and non-exhaustive example, and from the appended drawings of which:

FIG. 13 presents the decomposition of a third local code (6, 5, 2) usable in a total code according to an embodiment of the invention, into two trellis sections each carrying three label bits;

FIGS. 14A and 14B respectively illustrate the two sections of the local code (6, 5, 2) of FIG. 13;

FIG. 15 is the information transfer curve pertaining to the base code built with a trellis of two-state trellis code sections (6, 5, 2);

Figure 1:
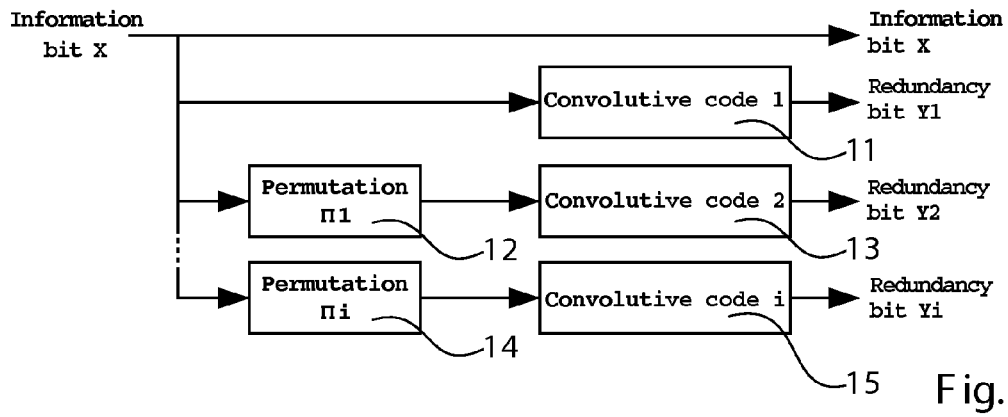
FIG. 1, discussed in the introduction provides a schematic view of the principle of the turbo-code, according to the prior art.
Figure 2:
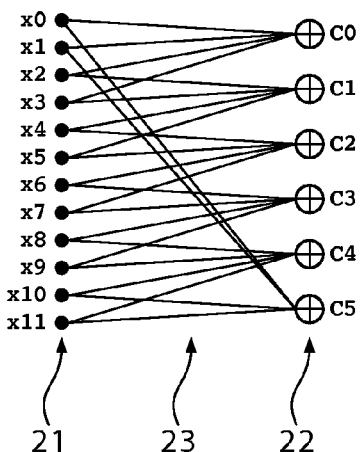
FIG. 2, also discussed in the introduction, provides a representation, by means of a Tanner graph, of an LDPC code (4, 2) according to the prior art.
Figure 3:
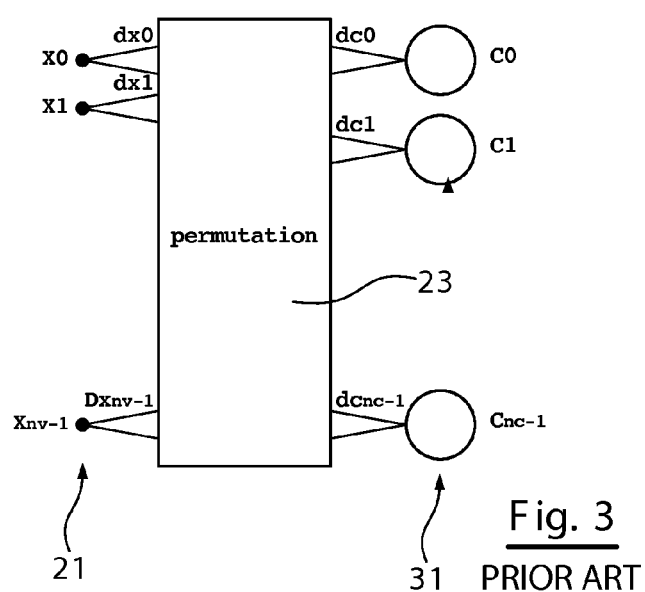
FIG. 3, also discussed in the introduction, provides a general illustration of a Tanner code, by means of a Tanner graph according to the prior art.

DETAILED DESCRIPTION OF ILLUSTRATIVE EMBODIMENTS 1.1 Introduction

As indicated further above, an embodiment of the invention relies on a novel approach to error corrector codes implementing very simple local codes, that are solely error detector codes, combined so as to give a final total code that is simpler and more efficient than the prior art codes.

Thus, the codes of an embodiment of the invention can be distinguished by a reduction of the complexity through the use of binary trellises with small numbers of states (2 and 4 states). It can be estimated that the complexity of a code built with these two-state (and respectively four-states) trellises is reduced by a factor whose order of magnitude is 8 (and 4 respectively) as compared with the 16-state turbo-codes and equivalent LDPC codes already in the standards.

Despite the low complexity of their trellises, the codes obtained offer a better compromise in terms of complexity, error correction capacity and "error-floor" of the best turbo-codes and of currently used LDPC codes because these new codes perform at least as efficiently in terms of error rate and have "error-floors" that are equally easy to use in practice.

The following table summarizes the performance characteristics and the complexity of a few codes obtained, described in detail here below.

The parameters of a local code are: (number of label bits, dimension, maximum borderline $d_{min}$ of the base code built with this code).

"local codes". To prevent any ambiguity in the notation, the built code is called a "total code".

To this end, the code is built as follows:
the state bits of the local codes are connected to one another
at least the majority of the bits of variables (including the information bits as well as the redundancy bits) are repeated and connected to the base code by means of a permutation which changes the order of these repeated bits of variables (not new).

An advantageous approach of an embodiment of the invention includes choosing particular local code sections to meet the following criteria:
the number of base code words (large trellis) having a length of m bits of significance 2 is smaller than or equal to m divided by 2;
the number of base code words having a length of m bits of significance 3 is non-zero.

This approach has been applied for the six local codes described here below.

An explanation of these high-performance characteristics is the following: it is necessary to take error correction codes of very small distance (which is a counter-intuitive), the minimum being 2. In this case, the codes are not even corrector codes and may detect only one error.

They therefore have an information extraction threshold that is the lowest possible threshold in the presence of transmission noise. A large number of words of significance 3 can be used to obtain "total" correction codes of a minimum large distance. Thus, error corrector codes are obtained that may attain Shannon's limit capacity and hence the minimum distance can increase linearly as a function of the length of the code.

What has to be done therefore is to concatenate small codes that are solely detector codes.

| Efficiency Total code | Local code parameters Number of states of the trellis | Local code rate | % correction erasures (% theoretical max) | Code asymptotically good (AG) yes/no | Comments Rival codes |
|---|---|---|---|---|---|
| 1/3 = 0.333 | (6, 4, 2) 2 states | 2/3 | 61% (max = 66.6%) | AG yes | |
| 1/2 = 0.500 | (4, 3, 2) 2 states | 3/4 | 45.3% (max = 50%) | AG yes | LDPC (3, 6) 42.9% Corrected |
| 2/3 = 0.666 | (6, 5, 2) 2 states 3 bits/branch | 5/6 | 30% (max = 33.3%) | AG no | |
| 3/4 = 0.750 | (8, 7, 2) 4 states | 7/8 | 21.5% (max = 25%) | AG yes | |
| 3/4 = 0.750 | (8, 7, 2) 2 states 4 bits/branch | 7/8 | 22.15% (max = 25%) | AG no | |

It must also be noted that the given erasure correction gains for a binary erasure channel (BEC) result in non-negligible gains in a Gaussian channel.

1.2 Major Technical Elements of an Embodiment of the Invention

The building of a code according to an embodiment of the invention relies on a "base code" having a length m described by a trellis obtained by concatenation of trellis sections with very small numbers of states of small codes $C_j$ known as Each local code $C_j$ has a small number of label bits $$dC_j : m = \sum_j dC_j.$$

The order of these m bits is modified by a permutation of m bits then merged to form the bits of variables $x_i$, (i=0,1,n−1) of degrees $dx_i$.

Figure 4:
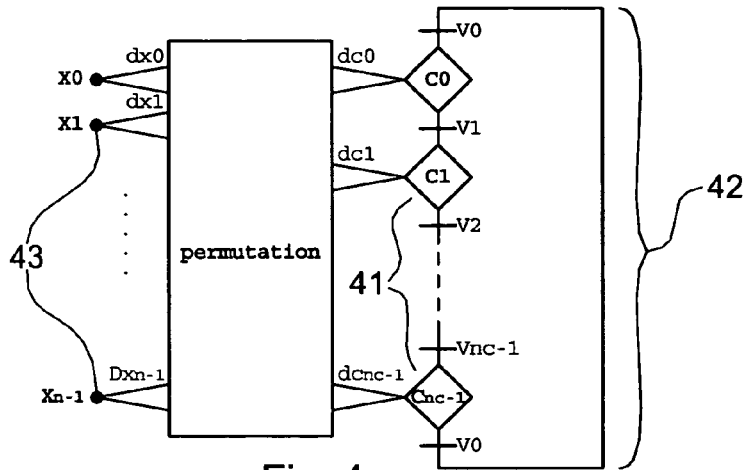
FIG. 4 is a Tanner graph illustrating the principle of an error corrector code according to an embodiment of the invention.

An essential technical element therefore is the use of a trellis formed by small local codes $C_j$ connected as described in FIG. 4.

This sequence of local codes $C_j$ 41 forms the base code 42 described by a trellis, and it is said that the trellis is cyclical or «tail-biting», if it forms a loop.

The n code bits 43 also called variables $x_i$, (i=0,1,n−1) are classically placed to the left of the Tanner graph of the code described in FIG. 4. These variables are repeated with degrees $dx_i$ that may differ from one another: the vector of these degrees $dx_i$ is called the repetition profile of the variables.

The permutation 44 changes the order of these bits as in the turbo-codes, the LDPC codes and the RA codes. To the right of the permutation of FIG. 4, there is placed the trellis of the base code 42 formed by the local codes $C_j$ possessing a number $dC_j$ of label symbols and $v_i$ input state bits and $v_{i+1}$ output state bits.

Figure 5:
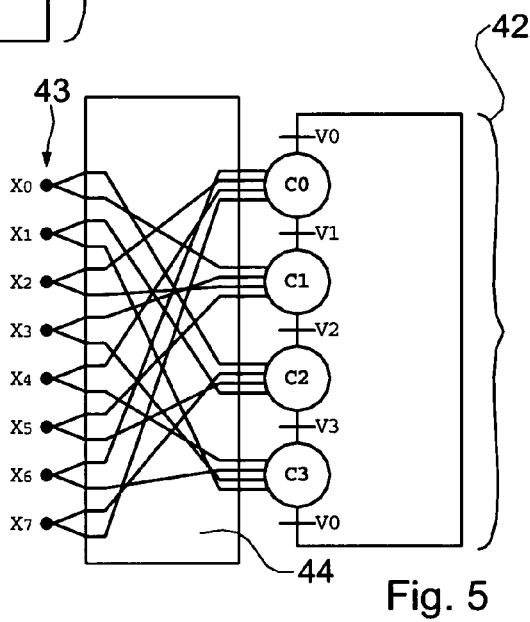
FIG. 5 is a Tanner graph of an exemplary code according to an embodiment of the invention having a length n=8 bits of constant second-degree variables with a base code having a length m=16 bits decomposed into four sections of local trellis codes with four label bits.

FIG. 5 is a Tanner's graph representing an example of a total code of this kind of an embodiment of the invention, having a length n=8 bits of second-degree variables constant with base code of a length m=16 bits decomposed into four local code trellis sections with four label bits.

The "tail-biting" trellis can be related to a classic non-cyclical trellis if one or more of the "state" bits between the local codes Ci are "set" at zero by construction. This technique of zero-state trellis termination is a well known technique that can be used to simplify the decoding process.

Figure 6:
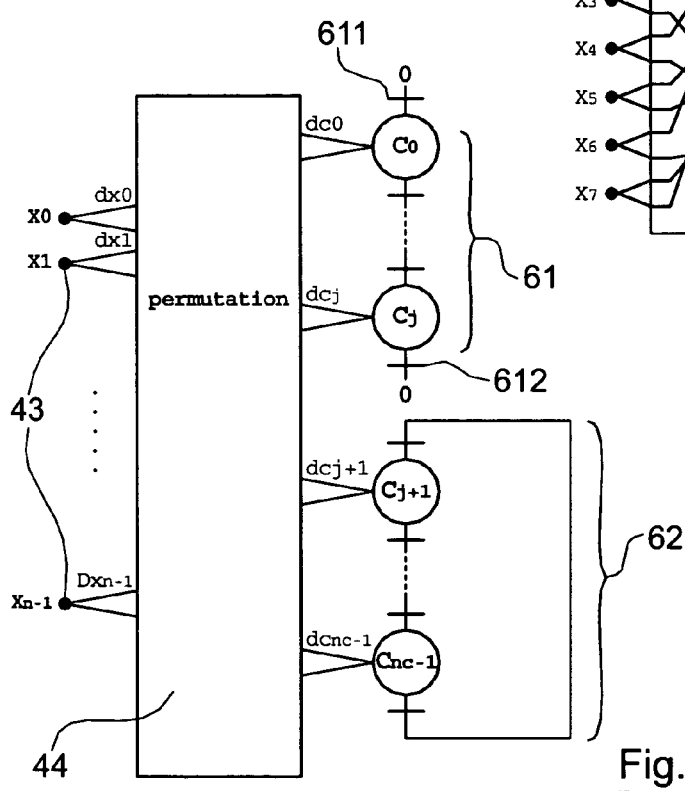
FIG. 6 is a Tanner graph of another exemplary code according to an embodiment of the invention, with trellis of the base code split up into two sub-trellises, one with zero-state termination and the other with "tail-biting"

As can be seen in FIG. 6, the division of a trellis into several sub-trellises 61 and 62 is possible. This enables the parallelizing of the decoding computations on each of the sub-trellises (before these parallel computations are synthesized) and is done without significant loss of performance in taking a sufficient number of sections in each of the sub-trellises.

FIG. 6 therefore describes a "total" code whose base code is divided into two sub-trellises 61 and 62: the top one (local codes C0 to Cj) 61 is a trellis known as a classic trellis whose termination states 611, 612 are equal to 0, and the bottom sub-trellis (local codes Cj+1 to Cnc−1) 62 is a "tail-biting" trellis whose termination condition is that the starting state must be equal to the arrival state.

An important construction element is the obtaining of high-performance permutations, i.e. permutations that give minimum large-distance codes. These permutations use special properties of the "patterns" (or sub-sets of bits that are invariant relative to their position in the code words) of the small local codes.

The combination of this particular structure of Tanner's graph with a trellis of small local codes with very small state numbers (2 or 4 states for the binary symbols) and these associated permutations give error correction codes providing a more efficient compromise {complexity, error correction performance} than all the best rival codes.

2. Example of Local Codes

2.1 Trellis Sections of the Two-State Local Code (6,4,2)

Figure 7:
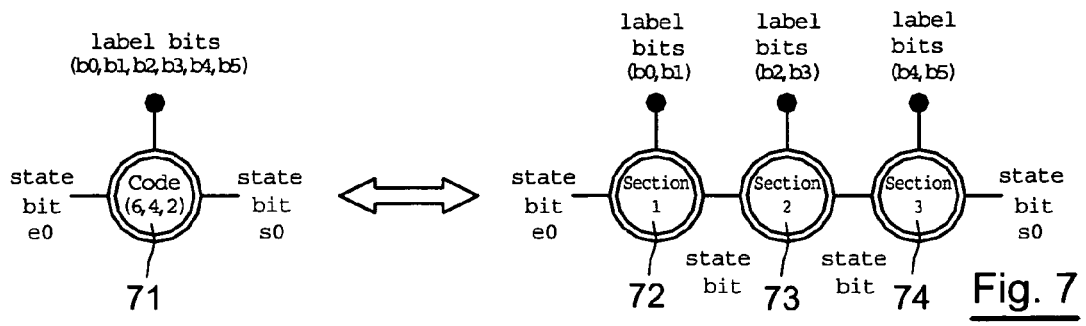
FIG. 7 presents the decomposition of a first local code (6, 4, 2) usable in a total code according to an embodiment of the invention, into three trellis sections each carrying two label bits.

The section described in FIG. 7 represents the set of code words of the local code of parameters by a set of paths going from one of the starting states to one of the arrival states in passing through the branches labeled by bits.

The local code (6,4,2) 71 is therefore decomposed into three trellis sections 72, 73 and 74 each carrying 2 label bits.

Figure 8A:
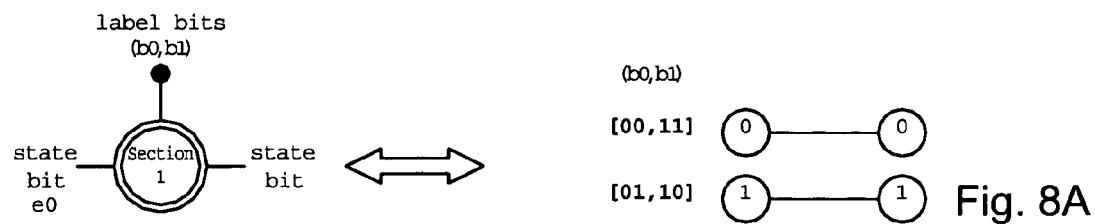
FIGS. 8A, 8B and 8C respectively illustrate the three sections of the local code (6, 4, 2) of FIG. 7.
Figure 8B:
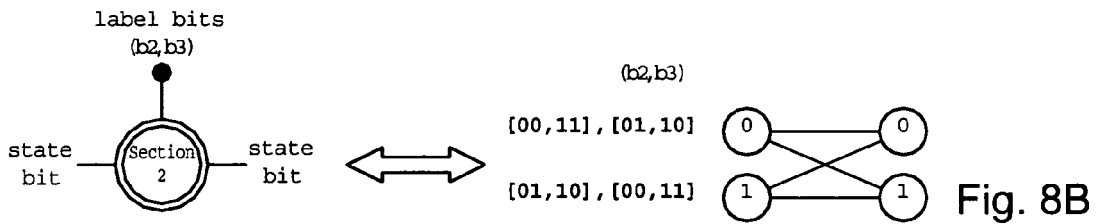
Figure 8C:
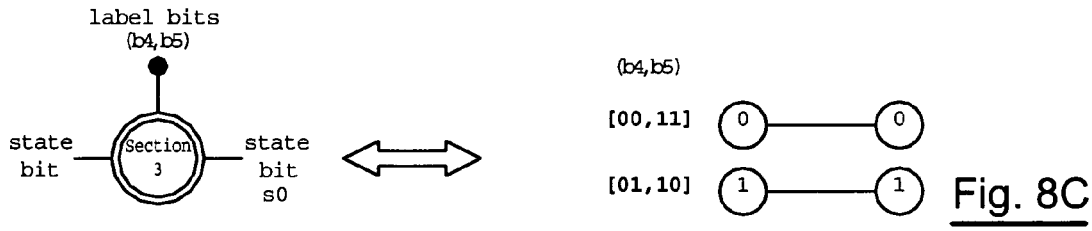

FIGS. 8A to 8C respectively present these three sections in a classic presentation.

The schematic notation of the trellis sections signifies that the transition from the input state 0 to the output state 0 can be achieved if the label bits are equal to 00 or 11. It is said that this is a double labeled branch.

The labels of a same branch (whether multiple or not) are placed within braces on a same line corresponding to a same input state and the successive braces correspond, in the same order, to the successive arrival states.

To further explain the trellis section of FIG. 8B: the transition from the input state 0 to the output state 0 can be done if the label bits are equal to 00 or 11, and the transition from the input state 0 to the output state 1 can be done if the label bits are equal to 01 or 10.

Obtained with two states only, the trellis sections enable soft-decision iterator decoding of very low complexity.

Furthermore, the algebraic properties of transition of significance are such that, taken separately, this code cannot correct any error but only detect one. However, assembled collectively in a trellis, the codes prove to be excellent codes with permutations adapted to their Hamming weight patterns.

Figure 9:
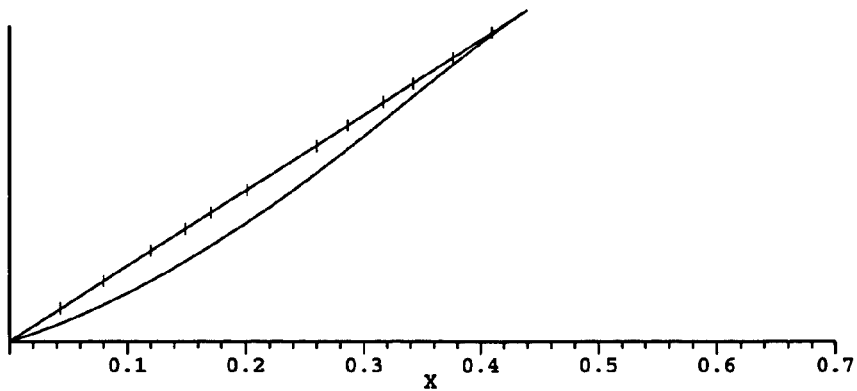
FIG. 9 is the information transfer curve pertaining to the base code built with a trellis of two-state trellis code sections (6, 4, 2)

FIG. 9 presents the information transfer curve of this base code built with a trellis of two-state trellis code sections (6,4,2).

2.2 Trellis Sections of the Two-State Local Code (4,3,2)

Figure 10:
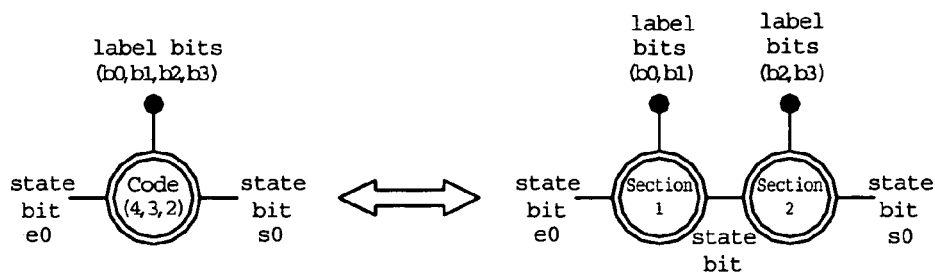
FIG. 10 presents the decomposition of a second local code (4, 3, 2) usable in a total code according to an embodiment of the invention, into two trellis sections each carrying two label bits.
Figure 11A:
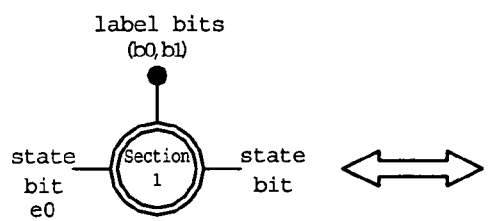
FIGS. 11A and 11B respectively illustrate the two sections of the local code (4, 3, 2) of FIG. 10.
Figure 11A:
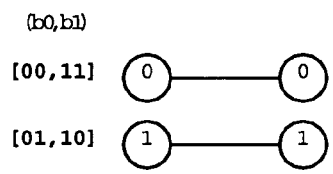
Figure 11B:
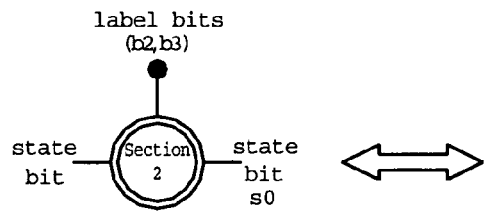
Figure 11B:
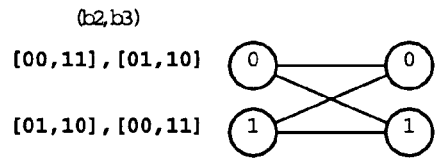

FIG. 10, according to the same principle as explained here above, presents the decomposition of the local code (4,3,2) into two trellis sections each carrying two label bits, and FIGS. 11A and 11B present the two sections of the trellis of the local code (4,3,2) with two corresponding states.

Figure 12:
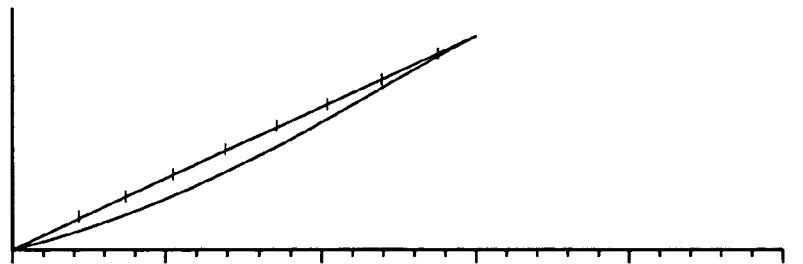
FIG. 12 is the information transfer curve pertaining to the base code built with a trellis of two-state trellis code sections (4, 3, 2)

As can be seen in FIG. 12, the information transfer curve is tangential to the straight line having a 45.3% slope at the point of origin, which implies a correction capacity of 45.3% of erasures of the total code for a possible maximum theoretical value of 50% for a rate-½ code.

2.3 Trellis Section of the Two-State Local Code (6,5,2)

FIG. 13, according to the same principle as explained here above, presents the decomposition of the local code (6, 3, 2) into two trellis sections each carrying three label bits, and FIGS. 14A and 14B present the two sections of the trellis of the local code (6,3,2) with two corresponding states.

Once again, it can be seen in FIG. 15 that the information transfer curve below is tangential to the straight line having a 30% slope at the point of origin, which implies a correction capacity of 30% of erasures of the total code for a possible maximum theoretical value of 33.33% for a rate-⅔ code.

2.4 Trellis Sections of the 4-State Local Code (8,7,2)

Figure 16:
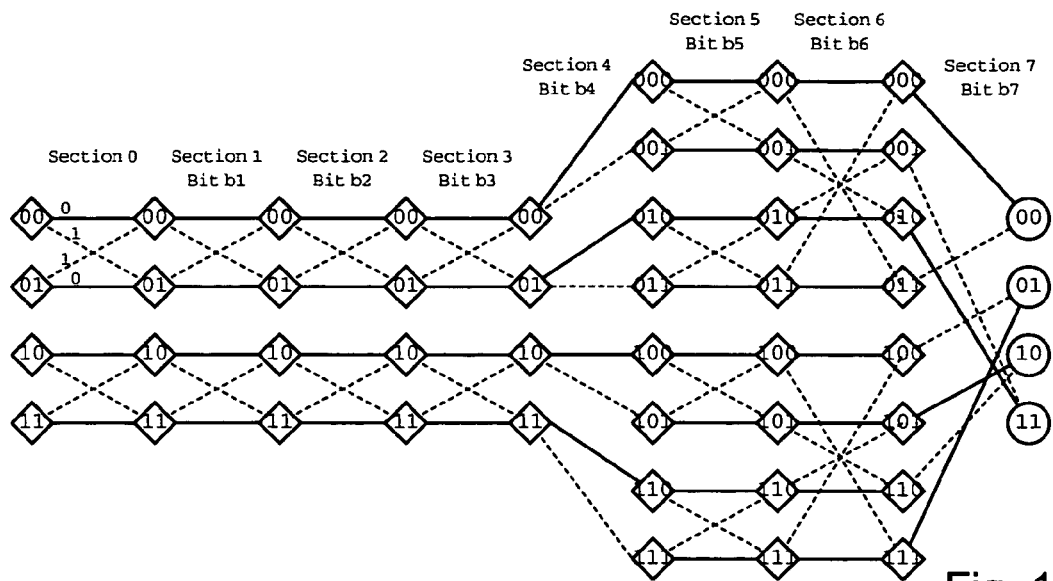
FIG. 16 presents an «exploded» non-sectionalized trellis of a fourth local four-state code (8, 7, 2) usable in a total code according to an embodiment of the invention.
Figure 17:
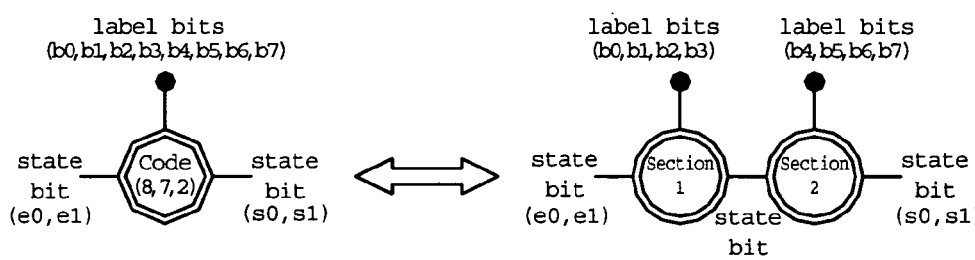
FIG. 17 presents the decomposition of a fifth local code (8, 7, 2) usable in a total code according to an embodiment of the invention, into two trellis sections each carrying four label bits.
Figure 18A:
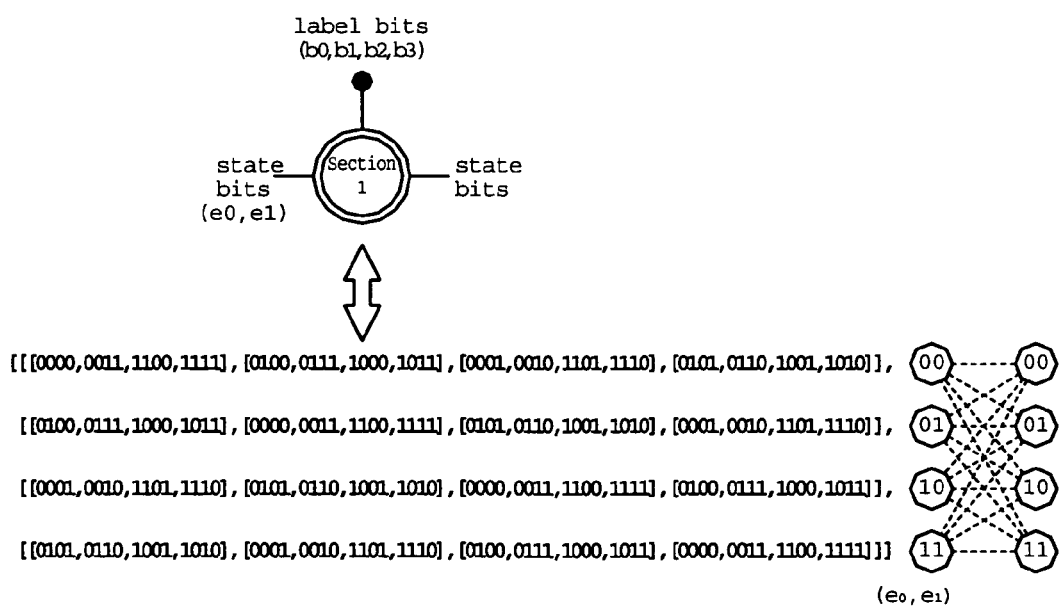
FIGS. 18A and 18B respectively illustrate the two sections of the local code (8, 7, 2) of FIG. 17.
Figure 18B:
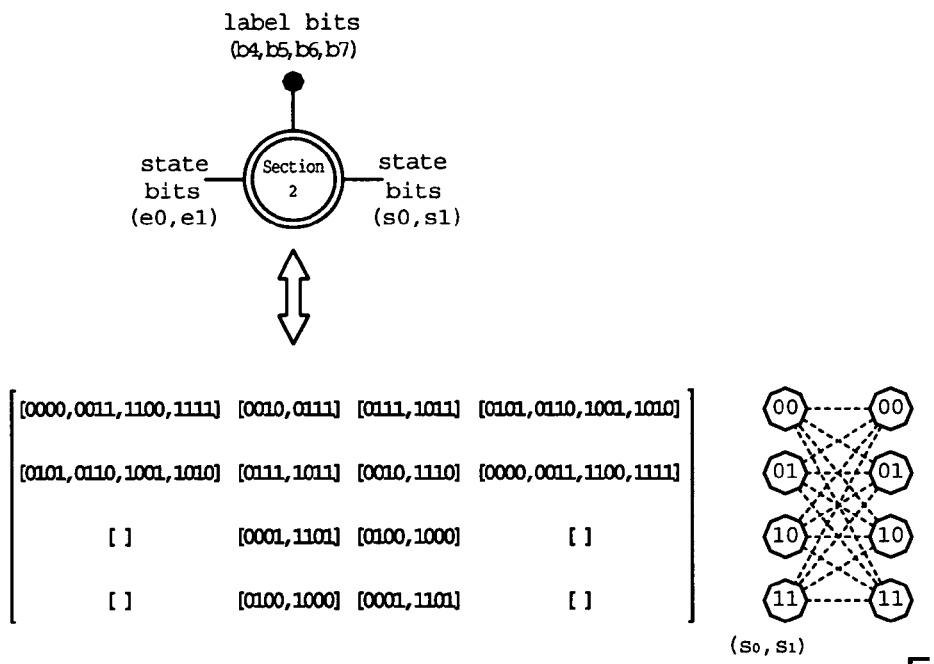

FIG. 16 describes the trellis "exploded" into 8 sections each having one label bit. The bits $(b_0,b_1,b_2,b_3)$ and the bits $(b_4,b_5,b_6,b_7)$ can be grouped together in two sections, each having four input states and four output states as can be seen in FIGS. 17, 18A and 18B.

Figure 19:
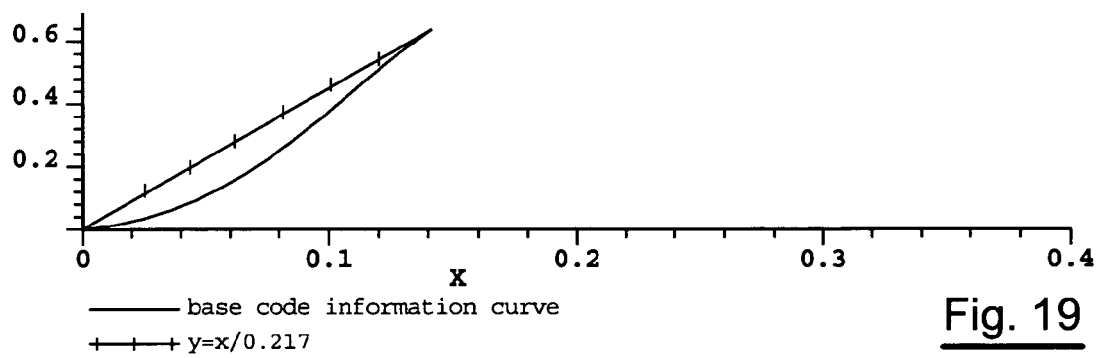
FIG. 19 is the information transfer curve pertaining to the base code built with a trellis of four-state trellis code sections (8, 7, 2)

The information transfer curve of FIG. 19 is tangential to the straight line having a 21.5% slope at the point of origin, which implies a correction capacity of 21.5% of erasures of the total code for a possible maximum theoretical value of 25% for a rate-¾ (=0.75) code. This is less than the 22.15% of the two-state local code (8,7,2) but this family of codes is asymptotically good (AG).

2.5 Trellis Sections of the 2-State Local Code (8,7,2)

Figure 20:
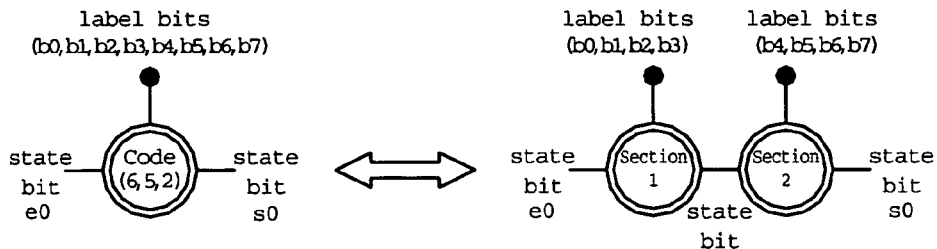
FIG. 20 presents another decomposition of the local code (8, 7, 2) into two trellis sections each carrying four label bits.
Figure 21A:
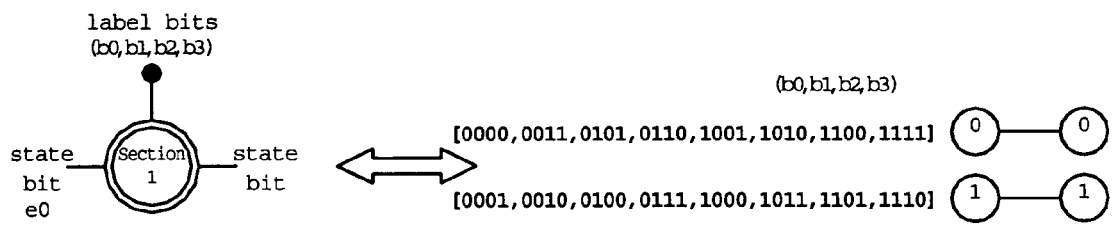
FIGS. 21A and 21B illustrate the two sections of the local code of FIG. 20.
Figure 21B:
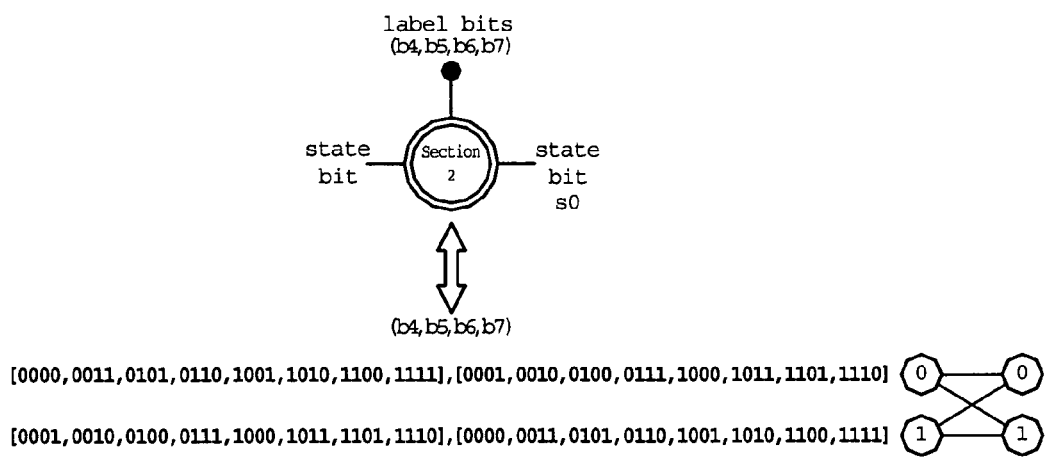

FIG. 20, according to the same principle as explained here above, presents the decomposition of the local code (8, 7, 2) into two trellis sections each carrying 4 label bits, and FIGS. 21A and 21B present the two sections of the trellis of the local code (6,3,2) with two corresponding states.

Figure 22:
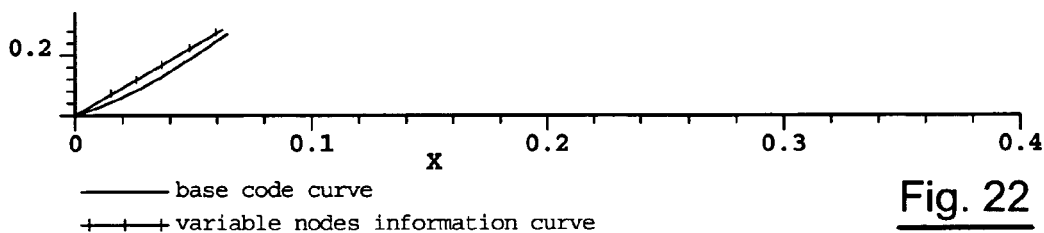
FIG. 22 is the information transfer curve pertaining to the base code built with a trellis of two-state trellis code sections (8, 7, 2)

The information transfer curve of FIG. 22 is tangential to the straight line having a 22.15% slope at the point of origin, which implies a correction capacity of 22.15% of erasures of the total code for a possible maximum theoretical value of 25% for a rate-¾ (=0.75) code.

2.6 Combinations of Trellis Sections to Form Other Local Codes (n,k,2)

As indicated in the paragraphs which respectively describe the two-state trellis sections forming the trellises of the codes having parameters (6,4,2) and (4,3,2), it is seen that the sections 1 are identical in both codes and identical also to section 3 of the code (4,3,2), and similarly the sections 2 are identical in both codes.

It is therefore possible to use all the sections forming the different codes already described and the possibility of puncturing or duplicating label bits on these sections to built new local codes of parameters (n,k,2) enabling a great variety of choice as regards code rates for the total code.

2.7 Example of a 4-State Code (4, 3, 2) on Z4

Z4 is the set of the integers {0, 1, 2, 3} provided with the addition modulo 4. This example of a code can be easily generalized to other alphabets because it suffices to replace the "addition on Z4" law by the law pertaining to addition on the new alphabet considered.

The method of construction consists to begin with the repetition code on the alphabets, in this case Z4:

repetition code on Z4={00,11,22,33}

Figure 23:
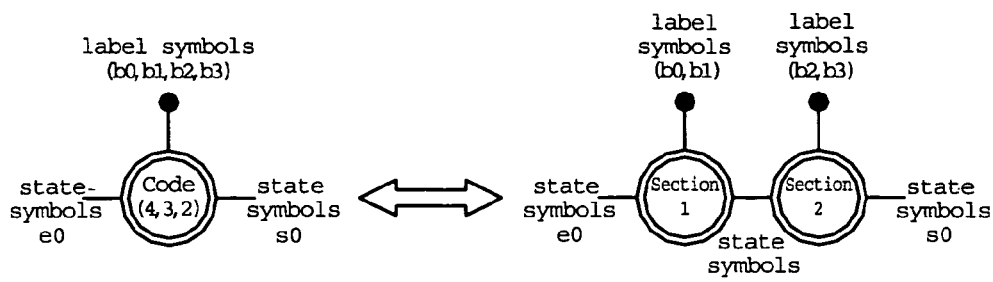
FIG. 23 presents the decomposition of a sixth local code (4, 3, 2) with four states on Z4.
Figure 24A:
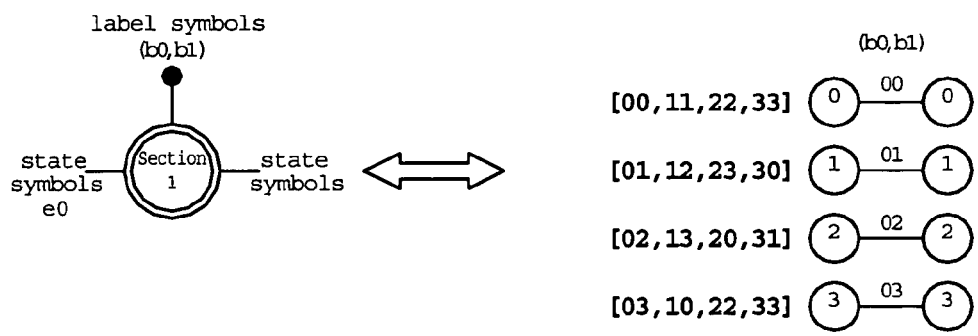
FIGS. 24A and 24B present the two trellis sections of FIG. 23.
Figure 24B:
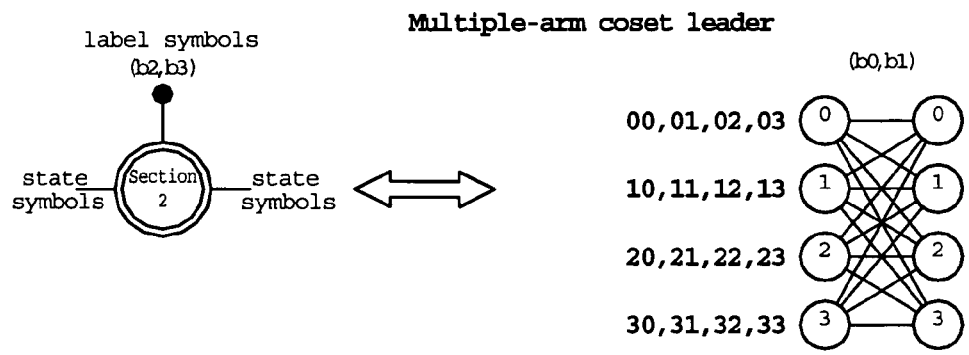

FIG. 23 illustrates the decomposition of this code in two sections, and FIGS. 24A and 24B present two corresponding sections.

The labels of a multiple branch are obtained from this repetition code by adding a same-length word ("coset leader" or word representing a lateral class). For example a multiple branch (or multibranch) 01 will have as labels: {01,12,23, 30}.

Naturally, the same generalization can be applied to Z8, Z16, . . . .

An embodiment of the disclosure provides an error correction encoding technique that is simpler to implement than prior art codes, especially turbo-code or LDPC type codes, and is more efficient.

Thus, an embodiment of the disclosure provides an encoding technique of this kind that can be used to reduce the complexity of the codes (and hence of the corresponding decoding operations) so as to reduce, for example, the silicon surface area used on the components and the necessary energy consumption.

In particular, an embodiment of the disclosure enables the construction of codes providing for a more efficient compromise between complexity and error correction capacity than is the case with best present-day correction codes. One of the goals pursued therefore is to obtain error correction codes that further improve the error correction performance of the best LDPC codes and turbo-codes in existence for lower complexity, in optimizing their capacities of information transmission for given channels: the binary symmetrical channel (BSC), binary erasure channel (BEC), Gaussian channel etc.

An embodiment of the disclosure provides an encoding technique of this kind that has very good error correction qualities approaching theoretical limits as closely as possible.

In particular, an embodiment of the disclosure provides error correction codes that are efficient even for small-sized blocks.

Thus, an embodiment of the disclosure enables the construction of very efficient, short error correction codes in removing, in practice, the "error-floor" phenomenon by increasing the minimum distances $d_{min}$. The term "error-floor" refers to the fact that the binary error rate (BER) decreases less rapidly for high signal-to-noise ratios than for the low signal-to-noise ratios, the part of the BET curve also called a "waterfall".

Although the present disclosure has been described with reference to preferred embodiments, workers skilled in the art will recognize that changes may be made in form and detail without departing from the spirit and scope of the disclosure.

3. Bibliography

[1] Gallager, «Low Density Parity Check codes», Ph.D. Thesis, MIT, July 1963.
[2] R. M. Tanner, «A recursive approach to low complexity codes», IEEE Transactions on Information Theory, vol IT-27, pp. 533-547, September 1981.
[3] C. Berrou, A. Glavieux and P. Thitimajshima, «Near Shannon limit error-correcting coding and decoding: Turbo codes», pp. 1064-1070, Proceedings of the International Communications Conference (ICC), May 1993, Geneva.
[4] D. Divsalar and R. J. McEliece, «Coding theorems for turbo-like codes», Proceedings of the Allerton Conference (Allerton, Ill., USA), pp. 201-210, September 1998.
[5] T. Richardson and R. Urbanke, "The Capacity of Low-Density Parity Check Codes under Message-Passing Decoding," IEEE Transactions on Information Theory, vol. 47, pp. 599-681, February 2001.
[6] T. Richardson, A. Shokrollahi and R. Urbanke, "Design of Capacity Approaching Irregular Low-Density Parity Check Codes," IEEE Transactions on Information Theory, vol. 47, pp. 619-637, February 2001.

The invention claimed is:

1. An encoding method implemented by an encoding device, associating redundancy data with source data and implementing a plurality of local codes setting up an association between at least one input state word and at least one output state word, according to at least one label word, comprising:
   a connection step, interconnecting the local codes by the input and output state words associated with the local codes to form at least one encoding trellis, each trellis defining a base code formed by at least two trellis sections, said local codes being error detection codes in a predetermined encoding alphabet, and wherein the connection step is performed by the encoding device, and;
   a permutation step, repeating the redundancy data and source data and changing the order of the repeated data, delivering the label words used to associate the input state words to the output state words, and wherein the permutation step is performed by the encoding device.

2. The encoding method according to claim 1, wherein said permutations are applied to said label words.

3. The encoding method according to claim 1, wherein said local codes are binary codes represented by two-state or four-state trellises.

4. The encoding method according to claim 1, wherein said local codes are defined on an encoding alphabet with $2^n$ elements, and are represented by trellises with $2^n$, $2^{n+1}$ or $2^{n+2}$ states, with n being an integer greater than 2.

5. The encoding method according to claim 1, wherein the base code delivers code words with a length of m symbols, each corresponding to at least one bit, of an encoding alphabet defined so that:
- the number of code words with a significance of 2 is lower than or equal to m/2; and
- the number of code words with a significance of 3 is not 0, the significance of a code word being the number of symbols different from 0 that the code word contains.

6. The encoding method according to claim 1, wherein a puncturing is implemented on at least one of said base codes.

7. The encoding method according to claim 1, wherein at least one of the trellises comprises a cyclical trellis.

8. The encoding method according to claim 1, wherein at least one of the trellises comprises a trellis with an input state and an output state set at predetermined values.

9. The encoding method according to claim 1, wherein at least one of said local codes comprises a two-state code (6, 4, 2) setting up an association, with an input state bit, of an output state bit, as a function of six label bits, where:
- 6 is the length of said local code, or the number of the label bits of the local code;
- 4 is the size of said local code;
- 2 is the minimum distance from said base code.

10. The encoding method according to claim 9, wherein said base code is formed by three sections of said code (6, 4, 2).

11. The encoding method according to claim 1, wherein at least one of said local codes comprises a two-state code (4, 3, 2) setting up an association, with an input state bit, of an output state bit, as a function of four label bits, where:
- 4 is the length of said local code, or the number of the label bits of the local code;
- 3 is the size of said local code;
- 2 is the minimum distance from said base code.

12. The encoding method according to claim 11, wherein said base code is formed by two sections of said code (4, 3, 2).

13. The encoding method according to claim 1, wherein at least one of said local codes comprises a two-state code (6, 5, 2) setting up an association, with an input state bit, of an output state bit, as a function of six label bits, where:
- 6 is the length of said local code, or the number of the label bits of the local code;
- 5 is the size of said local code;
- 2 is the minimum distance from said base code.

14. The encoding method according to claim 13, wherein said base code is formed by three sections of said code (6, 5, 2).

15. The encoding method according to claim 1, wherein at least one of said local codes comprises a four-state code (8, 7, 2) setting up an association, with an input state bit, of an output state bit, as a function of eight label bits, where:
- 8 is the length of said local code, or the number of the label bits of the local code;
- 7 is the size of said local code;
- 2 is the minimum distance from said base code.

16. The encoding method according to claim 15, wherein said base code is formed by eight sections of said code (8, 7, 2).

17. The encoding method according to claim 1, wherein at least one said local codes comprises a two-state code (8, 7, 2) setting up an association, with an input state bit, of an output state bit, as a function of eight label bits, where:
- 8 is the length of said local code, or the number of the label bits of the local code;
- 7 is the size of said local code;
- 2 is the minimum distance from said base code.

18. The encoding method according to claim 17, wherein said base code is formed by eight sections of said code (8, 7, 2).

19. A method for decoding data encoded by the method according to claim 1, implemented by a decoding device, wherein the method implements, symmetrically with an encoding, a plurality of local codes setting up an association between at least one input state word and at least one output state word, according to at least one label word, comprising the following steps:
- a connection step, interconnecting the local codes by the associate state words to form at least one encoding trellis, each trellis defining a base code code formed by at least two trellis sections, said local codes being error detection codes in a predetermined encoding alphabet, and wherein the connection step is performed by the decoding device, and
- a permutation step, repeating the redundancy data and source data and changing the order of the repeated data, delivering the label words used to associate the input state words to the output state words, and wherein the connection step is performed by the decoding device.

20. A device for sending encoded data, comprising encoding means implementing a plurality of local codes setting up an association between at least one input state word and at least one output state word, according to at least one label word, comprising:
- connection means interconnecting the local codes by the input and output state words associated with the local codes to form at least one encoding trellis, each trellis defining a base code code formed by at least two trellis sections, said local codes being error detection codes in a predetermined encoding alphabet, and
- permutation means, repeating the redundancy data and source data and changing the order of the repeated data, delivering the label words used to associate the input state words to the output state words.

21. A device for receiving encoded data, wherein the device comprises decoding means acting symmetrically with an encoding, by a plurality of local codes setting up an association between at least one input state word and at least one output state word, according to at least one label word, the decoding means comprising:
- connection means interconnecting the local codes by the input and output state words associated with the local codes to form at least one encoding trellis, each trellis defining a base code code formed by at least two trellis sections, said local codes being error detection codes in a predetermined encoding alphabet, and
- permutation means, repeating the redundancy data and source data and changing the order of the repeated data, delivering the label words used to associate the input state words to the output state words.

22. A device for storing an encoded data, wherein the device comprises at least one of encoding means or decoding means, implementing a plurality of local codes setting up an association between at least one input state word and at least one output state word, according to at least one label word, comprising:

connection means interconnecting the local codes by the input and output state words associated with the local codes to form at least one encoding trellis, each trellis defining a base code code formed by at least two trellis sections, said local codes being error detection codes in a predetermined encoding alphabet, and permutation means, repeating the redundancy data and source data and changing the order of the repeated data, delivering the label words used to associate the input state words to the output state words.

* * * * *

UNITED STATES PATENT AND TRADEMARK OFFICE
CERTIFICATE OF CORRECTION

PATENT NO. : 7,836,384 B2  
APPLICATION NO. : 11/597927  
DATED : November 16, 2010  
INVENTOR(S) : Jean-Pierre Tillich et al.

Page 1 of 1

It is certified that error appears in the above-identified patent and that said Letters Patent is hereby corrected as shown below:

In the Claims

Column 14, Claim 19:

At line 21, delete "base code code formed" and insert -- base code formed --

Column 14, Claim 20:

At line 39, delete "base code code formed" and insert -- base code formed --

Column 14, Claim 21:

At line 55, delete "base code code formed" and insert -- base code formed --

Column 15, Claim 22:

At line 4, delete "base code code formed" and insert -- base code formed --

Signed and Sealed this  
Sixteenth Day of June, 2015

Michelle K. Lee  
*Director of the United States Patent and Trademark Office*